United States Patent [19]
Kasahara

[11] Patent Number: 5,338,966
[45] Date of Patent: Aug. 16, 1994

[54] VARIABLE CAPACITANCE DIODE DEVICE

[75] Inventor: Takeshi Kasahara, Tsurugashima, Japan

[73] Assignee: Toko Kabushiki Kaisha, Tokyo, Japan

[21] Appl. No.: 76,024

[22] Filed: May 27, 1993

Related U.S. Application Data

[63] Continuation of Ser. No. 870,225, Apr. 20, 1992, abandoned, which is a continuation of Ser. No. 584,794, Sep. 19, 1990, abandoned.

[30] Foreign Application Priority Data

Sep. 21, 1989 [JP] Japan .................. 1-246155
Sep. 21, 1989 [JP] Japan .................. 1-246156

[51] Int. Cl.$^5$ ............................ H01L 29/93
[52] U.S. Cl. ............... 257/597; 257/595; 257/596
[58] Field of Search .......... 357/14, 15, 13, 38; 257/312, 595, 596, 597, 598, 603, 604, 605, 606

[56] References Cited

U.S. PATENT DOCUMENTS

| | | | |
|---|---|---|---|
| 3,466,010 | 8/1969 | Domemico et al. | 357/14 |
| 3,506,888 | 4/1970 | Siebertz et al. | 357/14 |
| 3,538,397 | 11/1970 | Davis | 357/14 |
| 3,893,153 | 7/1975 | Page et al. | 357/38 |
| 3,914,782 | 10/1975 | Nakata | 357/38 |
| 4,267,557 | 5/1981 | Muramoto et al. | 357/13 |
| 4,652,895 | 3/1987 | Roskos | 357/13 |

FOREIGN PATENT DOCUMENTS

| | | | |
|---|---|---|---|
| 55-85077 | 6/1980 | Japan | 357/132 |
| 56-90565 | 7/1981 | Japan | 357/14 |
| 5943571 | 7/1981 | Japan | 357/13 |

Primary Examiner—William L. Sikes
Assistant Examiner—Hung Xuan Dang
Attorney, Agent, or Firm—Stevens, Davis, Miller & Mosher

[57] ABSTRACT

There is provided a variable capacitance diode device. The device comprises a semiconductor substrate of a first conductive type, an epitaxial layer of the first conductive type with a high specific resistance formed on the semiconductor substrate, a first diffusion layer of the first conductive type, in which impurities are more diffused than the epitaxial layer, formed in the epitaxial layer and a second diffusion layer of a second conductive type which forms a junction with the first diffusion layer. The first diffusion layer is formed in a hollow cylindrical body or a hollow square pole body, etc., so as to enlarge an outer peripheral area thereof.

14 Claims, 4 Drawing Sheets

VARIABLE CAPACITANCE DIODE DEVICE

This application is a continuation of application Ser. No. 07/870,225, filed Apr. 20, 1992 (abandoned) which was a continuation of application Ser. No. 07/584,794 filed Sep. 19, 1990 (abandoned).

BACKGROUND OF THE INVENTION

This invention relates to a variable capacitance diode device applicable to high frequency use and used as a tuning device. More particularly, the invention relates to a variable capacitance diode device with a high quality factor Q.

FIGS. 1A and 1B show a conventional variable capacitance diode device. In these figures, a semiconductor body is composed of a semiconductor substrate (N++) 10 of N-conductive type with high impurity concentration and a low specific resistance and an epitaxial layer (N--) 20 of N-conductive type with a relatively high specific resistance formed on the semiconductor substrate 10.

A diffusion layer (N+) 30 of N-conductive type with high impurity concentration is diffused from a main surface of the semiconductor body to the epitaxial layer 20 so as to reach the semiconductor substrate 10.

Next, a diffusion layer (P++) 40 of P-conductive type with high impurity concentration is diffused to form a main PN junction $J_1$ with the diffusion layer 30.

A silicon dioxide film, produced in a diffusion process of the diffusion layers 30 and 40, covering a central main surface portion of the device is removed. Also, a silicon dioxide film 50 covering a PN junction $J_2$ also formed by diffusing the diffusion layer 40, exposed to the main surface of the semiconductor body, is allowed to remain as a protection film.

A conductor film 60 of e.g. aluminium is formed on the main surface-exposed portion of the semiconductor body having the silicon dioxide film 50. Wires 70 of gold are then bonded to the conductor film 60 to form the variable capacitance diode device.

When the conventional variable capacitance diode device is used at a high frequency, the area of an outer peripheral wall of the diffusion layer 30, which is diffused in a column-shape for obtaining a required maximum capacitance $C_{max}$, should be extremely small.

Convergence of electrical field thus occurs due to the skin effect at the high frequency at the area of an outer peripheral wall of the diffusion layer 30. This leads to a high frequency-series resistance which is large and which lowers the quality factor Q.

Furthermore, if the PN junction $J_2$ of the diffusion layers 30 and 40 is formed not so deep in order to have a larger capacitance-variation ratio, the PN junction $J_2$ is sometimes destroyed due to the stress of the pressure of a capillary (not shown) when wires 70 are bonded by thermocompression bonding. This degrades the reliability of the diode device.

A junction area of a variable capacitance diode device for high frequency use is made extremely small to satisfy recent demands for the higher quality factor Q and smaller maximum capacitance $C_{max}$.

For example, a variable capacitance diode device used in a radio for AM broadcasting has an approximate maximum capacitance $C_{max}$ in the range of 350 to 650 pF. Also, in UHFTV band, a maximum capacitance $C_{max}$ approximately in the range of 0.1 to 15 pF is required. This causes the junction area to be extremely small.

On the other hand, with the variable capacitance diode device for high frequency use, the area of the conductor film 60 for wire bonding should be extremely large with respect to the junction area.

Usually, each size of wire-bonded portions 71 of the wires 70 to the device becomes about 3 to 5 times the diameter of each wire 70. The diameter of each wire-bonded portion 71 thus becomes 75 to 125 $\mu$m if that of the wire 70 is 25 $\mu$m. Therefore, the area of the conductor film 60 is made extremely large so that the wire-bonded portions 71 do not protrude therefrom. This causes unnecessary floating capacitance to be produced between the conductor film 60 extended from the PN junction $J_2$ like a hook and the epitaxial layer 20. This degrades the high frequency characteristics of the device.

SUMMARY OF THE INVENTION

It is an object of the present invention to provide a variable capacitance diode device with preferable high frequency characteristics and a quality factor Q.

Another object of the present invention is to provide a variable capacitance diode device with diffusion layers for forming junctions which are difficult to destroy when wires are bonded to the device.

According to the present invention, there is provided a variable capacitance diode device comprising a semiconductor substrate of a first conductive type, a semiconductor layer of the first conductive type having impurities which are diffused therein, formed on the semiconductor substrate, a first diffusion layer of the first conductive type having impurities which are more diffused therein than the semiconductor layer, formed therein and having a cylindrical shape, i.e., an annular or ring-like shape, to encircle a portion of the semiconductor layer, and a second diffusion layer of a second conductive type having impurities diffused therein to form a junction with the first diffusion layer.

The device further comprises a semiconductor substrate of a first conductive type, a semiconductor layer of the first conductive type having impurities which are diffused therein, formed on the semiconductor substrate, a first diffusion layer of the first conductive type having impurities which are more diffused therein than the semiconductor layer, formed therein and having a cylindrical shape, i.e., an annular or ring-like shape, to encircle a portion of the semiconductor layer, a second diffusion layer of a second conductive type with an enclosed space, having impurities diffused to form a junction with the first diffusion layer, a first insulation film covering a semiconductor main surface enclosed by the second diffusion layer and a junction formed by the semiconductor layer and the second diffusion layer, exposed to the semiconductor main surface, a second insulation film covering a junction formed by the semiconductor layer exposed to the semiconductor main surface and the second diffusion layer and a conductor film covering a main surface-exposed portion of the second diffusion layer and the first insulation film.

Other objects and advantages of the present invention will become apparent from the detailed description to follow taken in conjunction with the appended claims.

DETAILED DESCRIPTION OF THE PREFERRED EMBODIMENTS

Figure 1A:
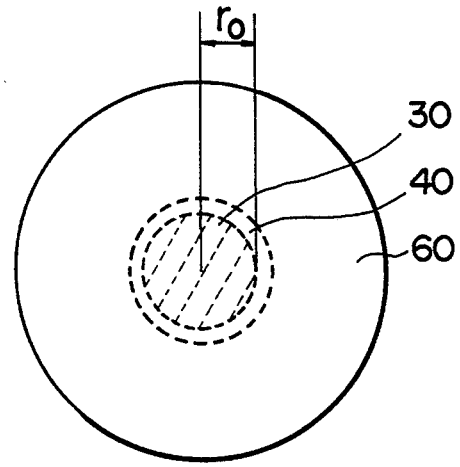
FIG. 1A is a plan view of a conventional variable capacitance diode device.

The preferred embodiments according to the present invention will be explained in detail with reference to the accompanying drawings.

Throughout the drawings, like reference numerals and letters are used to designate like or equivalent elements for the sake of simplicity.

Figure 2A:
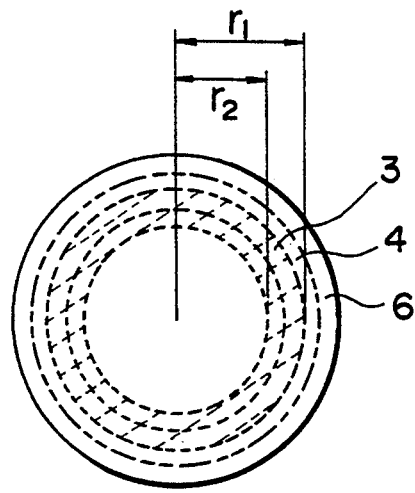
FIG. 2A is a plan view of a preferred embodiment of a variable capacitance diode device according to the present invention.
Figure 2B:
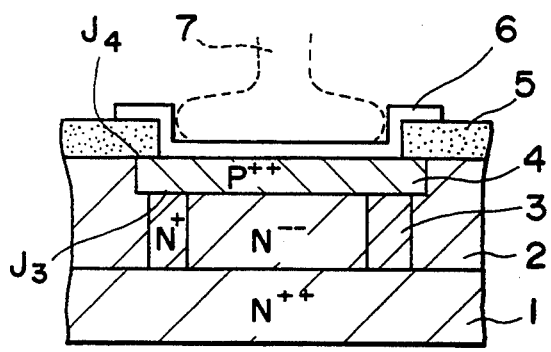
FIG. 2B is a sectional view of the preferred embodiment of the variable capacitance diode device according to the present invention.

FIGS. 2A and 2B show a preferred embodiment of a variable capacitance diode device according to the present invention. In the figures, a semiconductor body is composed by depositing an epitaxial layer (N−−) 2 of N-conductive type with a high specific resistance on a semiconductor substrate (N++) 1 of N-conductive type with high impurity concentration by chemical vapour deposition.

A ring-shaped or cylindrically-shaped diffusion layer (N+) 3 of N-conductive type with high impurity concentration is diffused from a main surface of the epitaxial layer 2 so as to reach the semiconductive substrate 1.

Next, a diffusion layer (P++) 4 of P-conductive type with high impurity concentration is diffused to form a PN junction $J_3$ with the diffusion layer 3.

In a silicon dioxide film formed on a main surface of the semiconductor body during a diffusion process of the diffusion layer 3, the film covering a central surface portion of the device is removed. A silicon dioxide film 5 covering a PN junction $J_4$ exposed to the main surface portion of the device is allowed to remain a protection film.

A conductor film 6 of e.g. aluminium is attached to a main surface-exposed portion of the device, where the silicon dioxide film has been removed, to form electrodes. Wires 7 of gold are then bonded to the conductor film 6 to form a variable capacitance diode device.

In general, a maximum capacitance $C_{max}$ of a variable capacitance diode device is determined by multiplying a junction area S and an impurity concentration coefficient $\alpha$ of a junction surface together. Therefore, the junction area S or the impurity concentration coefficient $\alpha$ may be arranged small in order to make the maximum capacitance $C_{max}$ small to correspond to a high frequency.

The relationship between the maximum capacitance $C_{max}$ and the product of the junction area S and the impurity concentration coefficient $\alpha$ is expressed as follows:

$$C_{max} \alpha S \alpha \quad (1)$$

As is understood from the relationship (1), the junction area S or the impurity concentration coefficient $\alpha$ must be small to obtain a small maximum capacitance $C_{max}$ and a large capacitance-variation ratio.

However, there is a limit to arranging the impurity concentration coefficient $\alpha$ which is due to the impurity concentration of the semiconductor substrate. Namely, the quality factor Q is lowered if the impurity concentration of the epitaxial layer is arranged to be small so as to obtain a large sheet resistance of the epitaxial layer. There is thus a limit to arranging the impurity concentration of the semiconductor substrate small. From this view point, it is an effective way to arrange the junction area S small to obtain a small maximum capacitance $C_{max}$.

For example, if a maximum capacitance $C_{max}$ of a variable capacitance diode device for a radio in FM broadcasting use is in the range of 2 to 3 pF, and if the variable capacitance diode device is obtained in a production process, according to FIG. 1, a diameter of a junction area $S_1$ should be made small to 80 μm. When a radius of the junction area $S_1$ is $r_0$, the junction area $S_1$ is obtained from the following equation.

$$S_1 = \pi r_0^2 \quad (2)$$

In this preferred embodiment according to the present invention, a sheet resistance of the epitaxial layer 2 is arranged to be relatively high and the cylindrical diffusion layer 3 is formed in consideration of the skin effect.

In order to make the maximum capacitance $C_{max}$ of the variable capacitance diode device shown in FIGS. 2A and 2B equal to that of the conventional one shown in FIGS. 1A and 1B, a junction area of the diffusion layer 3 shown in FIGS. 2A and 2B is arranged to the junction area $S_O$ which is equal to the junction area $S_1$ shown in FIGS. 1A and 1B as follows:

That is, the junction area $S_O$ of the diffusion area of the variable capacitance diode device shown in FIGS. 2A and 2B is expressed by $$S_0 = \pi(r_1^2 - r_2^2) \quad (3)$$

Here, a radius of a circle of an outer periphery of the diffusion layer 3 is $r_1$, and that inner periphery is $r_2$.

Therefore, from the equations (2) and (3), the junction areas $S_O$ and $S_1$ are made equal to each other by setting the relationship among $r_0$, $r_1$ and $r_2$ as follows:

$$\pi r_0^2 = \pi(r_1^2 - r_2^2)$$

$$r_0^2 = r_1^2 - r_2^2 \quad (4)$$

By this arrangement, a surface area of an outer periphery of the cylindrical diffusion region 3 is greatly enlarged. Thus, the high frequency-series resistance on the basis of skin effect is made small and the quality factor Q is not lowered. The more the outer periphery of the diffusion region 3 is enlarged, the smaller the high frequency-series resistance and the higher the quality factor Q.

Figure 1B:
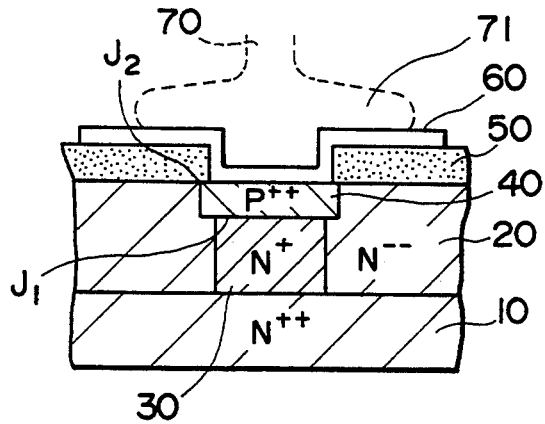
FIG. 1B is a sectional view of the conventional variable capacitance diode device.

Furthermore, in FIGS. 2A and 2B, when a diameter ($2r_1$) of a peripheral circle of the diffusion layer 3 is set at about a diameter of a wire-bonded portion of the wire 7 which is thermally bonded to the conductor film 6, the conductor film 6 is not unnecessarily enlarged as shown in FIGS. 1A and 1B. Therefore, there is no floating capacitance unnecessarily produced in the variable capacitance diode device.

Figure 3:
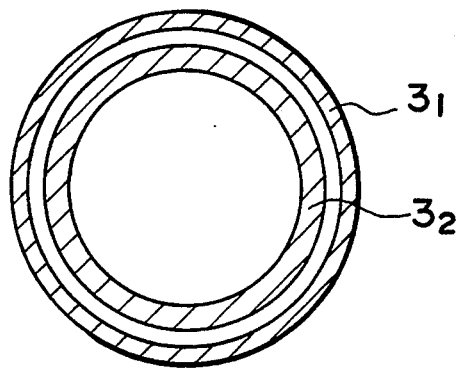
FIG. 3 is a plan view of another preferred embodiment of the diffusion layer shown in FIGS. 2A and 2B.

FIG. 3 shows another preferred embodiment of the diffusion layer of the variable capacitance diode device with respect to FIGS. 2A and 2B according to the present invention. There are a pair of cylindrical diffusion regions $3_1$ and $3_2$ formed in FIG. 3 as compared with the one diffusion layer 3 in FIGS. 2A and 2B.

The diffusion layer 3 may be formed as more than two concentric diffusion regions, but such embodiments are not shown. As is understood, the surface area of the peripheral wall of the diffusion layer is enlarged to further lower the high frequency-series resistance and improve the quality factor Q.

Figure 4:
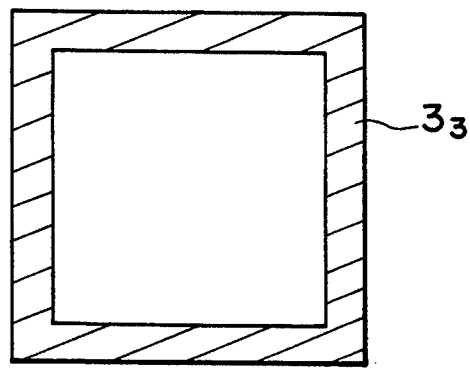
FIG. 4 is a plan view of still another preferred embodiment of the diffusion layer shown in FIGS. 2A and 2B.

FIG. 4 shows still another preferred embodiment of the diffusion layer of the variable capacitance diode device according to this present invention. In the figure, the diffusion layer 3 shown in FIGS. 2A and 2B is formed in a square pole to enlarge the peripheral wall thereof. The square diffusion region 33 may be formed as two or more square regions similarly to the concentric ring regions shown in FIG. 3.

Figure 5:
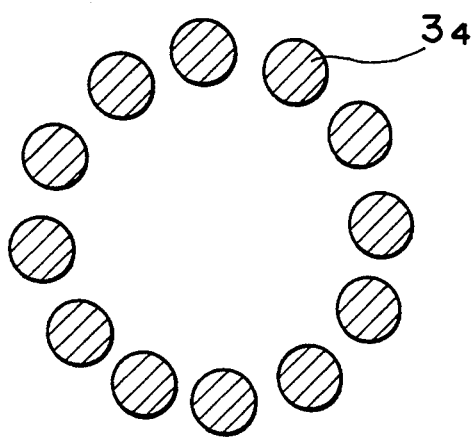
FIG. 5 is a plan view of a further preferred embodiment of the diffusion layer shown in FIGS. 2A and 2B.

FIG. 5 shows a further preferred embodiment of the diffusion layer of the variable capacitance diode device according to the present invention. There are provided cylindrical diffusion layers $3_4$ which are circularly distributed.

Figure 6A:
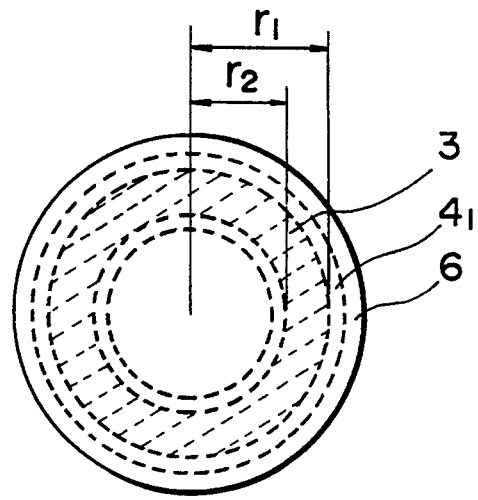
FIG. 6A is a plan view of another preferred embodiment of a variable capacitance diode device according to the present invention.
Figure 6B:
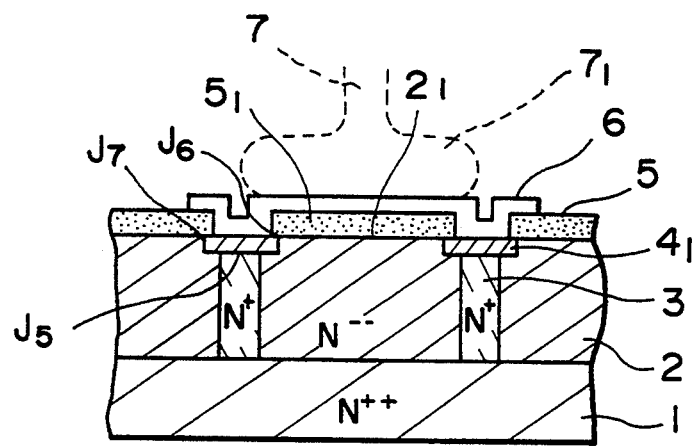
FIG. 6B is a sectional view of another preferred embodiment of the variable capacitance diode device according to the present invention.

FIGS. 6A and 6B show another preferred embodiment of the variable capacitance diode device according to the present invention. In these figures, an epitaxial layer (N$^{--}$) 2 of N-conductive type with a high specific resistance is formed on a semiconductor substrate (N$^{++}$) 1 of N-conductive type with high impurity concentration by chemical vapour deposition.

A ring-shaped or cylindrically-shaped diffusion layer (N$^+$) 3 of N-conductive type with high impurity concentration is diffused from a main surface of the semiconductor body of the epitaxial layer 2 so as to reach the semiconductor substrate 1.

Next, a diffusion layer (P$^{++}$) $4_1$ of P-conductive type with high impurity concentration is diffused to form a PN junction $J_5$ with the diffusion layer 3.

Silicon dioxide films covering the center portion of the device, formed during a diffusion process, remain as protection films, that is, a silicon dioxide film $5_1$ which covers a portion $J_6$ of a PN junction formed in an inner periphery of the hollow cylinder formed by the epitaxial layer 2 and the diffusion layer $4_1$ is exposed to a main surface of the device and also covers a device-center portion $2_1$ and a silicon dioxide film 5 which covers a portion $J_7$ of a PN junction formed in an outer periphery of the cylinder is exposed to the main surface of the device.

A conductor film 6 of e.g. aluminium is attached to a portion of the diffusion layer $4_1$ exposed by removing the silicon dioxide films and to the silicon dioxide film $5_1$ on the device-center portion $2_1$ to form electrodes.

Wires 7 of gold pulled out from a capillary not shown are connected to the conductor film 6 by thermocompression bonding. The wires 7 are then connected to external lead wires to form a variable capacitance diode device.

In the preferred embodiment of the variable capacitance diode device according to the present invention shown in FIG. 6B, since the silicon dioxide film $5_1$ is formed, the PN junction $J_5$ is protected from the pressure produced during thermal bonding. As a result, the diffusion layer $4_1$ is formed to be shallow to have further increase the capacitance-variation ratio.

Figure 7:
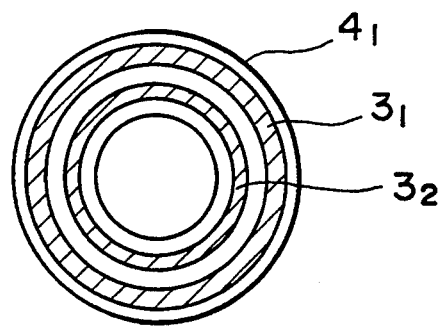
FIG. 7 is a plan view of another preferred embodiment of the diffusion layer shown in FIGS. 6A and 6B.

FIG. 7 shows another preferred embodiment of the diffusion layer 3 with respect to FIGS. 6A and 6B according to the present invention. FIG. 7 shows double cylindrical diffusion layers $3_1$ and $3_2$.

Figure 8:
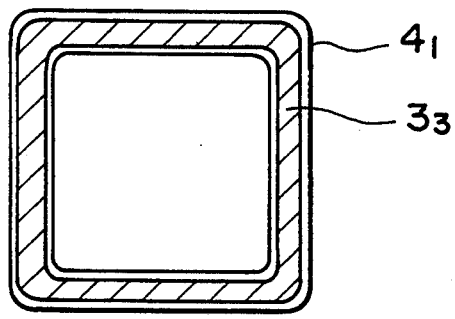
FIG. 8 is a plan view of still another preferred embodiment of the diffusion layer shown in FIGS. 6A and 6B.

FIG. 8 shows a still another preferred embodiment of the diffusion layer 3 with respect to FIGS. 6A and 6B according to the present invention. FIG. 8 shows a square tube diffusion layer $3_3$.

Figure 9:
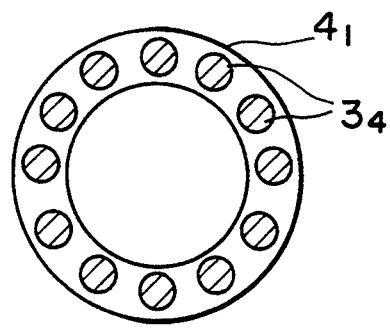
FIG. 9 is a plan view of a further preferred embodiment of the diffusion layer shown in FIGS. 6A and 6B.

FIG. 9 shows a further preferred embodiment of the diffusion layer 3 with respect to FIGS. 6A and 6B according to the present invention. FIG. 9 shows cylindrical diffusion layers $3_4$ which are circularly distributed.

As is understood from the foregoing, in the variable capacitance diode device according to the present invention, the diffusion layer determining a capacitance variation ratio is formed as an annular or ring-like shape or a plurality of cylinders so as to obtain a large area of the outer peripheral wall thereof with consideration of the skin effect at a high frequency. By this arrangement, a high frequency-series resistance is greatly reduced and the quality factor Q is improved.

Furthermore, by providing the silicon dioxide film beneath the conductor film to which the wires are bonded, the diffusion layer for forming the junctions is prevented from being destroyed. This improves the reliability of the variable capacitance diode device.

While the presently preferred embodiments of the present invention has been shown and described, it is to be understood that the disclosures are for the purpose of illustration and that various changes and modifications may be made without departing from the scope of the invention as set forth in the appended claims.

What is claimed is:

1. A variable capacitance diode device comprising:
   a semiconductor substrate of a first conductive type;
   an epitaxial layer of the first conductive type, having a low concentration of impurities deposited on said semiconductor substrate;
   a first diffusion layer of the first conductive type having a higher concentration of impurities diffused therein than the concentration in said epitaxial layer, said first diffusion layer being formed in said epitaxial layer and shaped in a form of a column having a cylindrical interior region, a cylindrical columnar portion of said epitaxial layer being disposed in said interior region; and
   a second diffusion layer of a second conductive type, having a high concentration of impurities diffused therein, said second diffusion layer being formed shallowly in a portion of said epitaxial layer above one end of said first diffusion layer to abut there against to form a P-N junction with the first diffusion layer.

2. A device according to claim 1, wherein the first diffusion layer is shaped in a form of a plurality of coaxial columns.

3. A device according to claim 1, wherein said column has a shape of a square tube.

4. A device according to claim 1, wherein said first diffusion layer is in contact on one side thereof with end second diffusion layer and on its outer side with end semiconductor substrate.

5. A variable capacitance diode device comprising:
a semiconductor substrate of a first conductive type;
an epitaxial layer of the first conductive type having a low concentration of impurities diffused therein and being deposited on said semiconductor substrate;
a first diffusion layer of the first conductive type having a higher concentration of impurities diffused therein than the concentration in said epitaxial layer, and said first diffusion layer being formed in said epitaxial layer and shaped in a form of a plurality of columns which are circularly distributed within said epitaxial layer; and
a second diffusion layer of a second conductive type having impurities diffused therein, said second diffusion layer being formed shallowly in a portion of said epitaxial layer above one end of said first diffusion layer to abut there against to form a junction with the first diffusion layer.

6. A device according to claim 5, wherein said first diffusion layer is in contact on one end thereof with said second diffusion layer and on its other end with said semiconductor substrate.

7. A variable capacitance diode device comprising:
a semiconductor substrate of a first conductive type;
an epitaxial layer of the first conductive type having a low concentration of impurities and being deposited on the semiconductor substrate;
a first diffusion layer of the first conductive type having a higher concentration of impurities diffused therein than the concentration in said epitaxial layer, said first diffusion layer being formed in said epitaxial layer in a form of a cylinder having a shape surrounding a portion of said epitaxial layer,
a second diffusion layer of a second conductive type, said second diffusion layer being diffused on said first diffusion layer to surround and enclose a main surface of said portion of said epitaxial layer and having impurities diffused therein to form a junction with the first diffusion layer;
a first insulation film covering (i) said main surface of said portion of said epitaxial layer enclosed by the second diffusion layer and (ii) a portion of an inner periphery of the second diffusion layer which is exposed to the main surface of the epitaxial layer;
a second insulation film covering an outer periphery of the second diffusion layer; and
a conductor film covering an exposed portion of a main surface of the second diffusion layer and the first insulation film.

8. A device according to claim 7, wherein the first diffusion layer is formed by a plurality of cylinders and the second diffusion layer is ring-shaped.

9. A device according to claim 7, wherein the first and second diffusion layers are shaped in a square tube-shape, respectively, the former being surrounded by the latter.

10. A device according to claim 7, wherein said first diffusion layer is in contact on one end thereof with said second diffusion layer and on its other end with said semiconductor substrate.

11. A variable capacitance diode device comprising:
a semiconductor substrate of a first conductive type;
an epitaxial layer of the first conductive type having impurities diffused therein and being deposited on the semiconductor substrate;
a first diffusion layer of the first conductive type having a higher concentration of impurities diffused therein than the concentration in said epitaxial layer, said first diffusion layer being formed in said epitaxial layer, said first diffusion layer comprising a plurality of column-shaped bodies which are circularly distributed within said epitaxial layer;
a second diffusion layer of a second conductive type, shaped in a ring configuration to enclose a portion of said main surface of said epitaxial layer and having impurities diffused therein to form a junction with the first diffusion layer;
a first insulation film covering (i) said portion of said main surface of said epitaxial layer enclosed by the second diffusion layer and (ii) a portion of an inner periphery of the second diffusion layer which is exposed to the semiconductor main surface;
a second insulation film covering an outer periphery of the second diffusion layer; and
a conductor film covering an exposed portion of a main surface of the second diffusion layer and the first insulation film.

12. A device according to claim 11, wherein said first diffusion layer is in contact on one end thereof with said second diffusion layer and on its other end with said semiconductor substrate.

13. A variable capacitance diode device comprising:
a semiconductor substrate of a first conductive type;
an epitaxial layer of the first conductive type having impurities diffused therein and being formed on the semiconductor substrate;
a first diffusion layer of the first conductive type having a higher concentration of impurities diffused therein than the concentration in the epitaxial layer, said first diffusion layer being formed in said epitaxial layer and comprising a plurality of cylindrically shaped bodies which are circularly distributed within said epitaxial layer;
a second diffusion layer of the first conductive type having a higher concentration of impurities diffused therein than the concentration in the epitaxial layer, said second diffusion layer being arranged within said epitaxial layer in an area enclosed by said first diffusion layer; and
a third diffusion layer of a second conductive type having impurities diffused therein to form a junction with the first and second diffusion layers.

14. A device according to claim 13, wherein said first diffusion layer is in contact on one end thereof with said second diffusion layer and on its other end with said semiconductor substrate.

* * * * *